United States Patent
Yang et al.

(10) Patent No.: US 10,748,473 B2
(45) Date of Patent: Aug. 18, 2020

(54) PIXEL STRUCTURE

(71) Applicant: AU Optronics Corporation, Hsin-Chu (TW)

(72) Inventors: Chuang-Cheng Yang, Hsin-Chu (TW); Ming-Hsien Lee, Hsin-Chu (TW); Kai-Wei Hong, Hsin-Chu (TW); Yi-Cheng Lin, Hsin-Chu (TW); Chun-Feng Lin, Hsin-Chu (TW)

(73) Assignee: AU OPTRONICS CORPORATION, Hsin-Chu (TW)

(*) Notice: Subject to any disclaimer, the term of this patent is extended or adjusted under 35 U.S.C. 154(b) by 0 days.

(21) Appl. No.: 16/527,758

(22) Filed: Jul. 31, 2019

(65) Prior Publication Data

US 2020/0098305 A1 Mar. 26, 2020

(30) Foreign Application Priority Data

Sep. 21, 2018 (TW) .............................. 107133479 A

(51) Int. Cl.
| | |
|---|---|
| *G09G 3/32* | (2016.01) |
| *H03K 17/00* | (2006.01) |
| *H03K 25/02* | (2006.01) |
| *H03K 7/08* | (2006.01) |
| *H03K 17/284* | (2006.01) |
| *G09G 3/20* | (2006.01) |

(52) U.S. Cl.
CPC ............. *G09G 3/32* (2013.01); *H03K 17/005* (2013.01); *H03K 25/02* (2013.01); *H03K 7/08* (2013.01); *H03K 17/284* (2013.01)

(58) Field of Classification Search
CPC ........ G09G 3/32; H03K 25/02; H03K 17/284; H03K 17/005; H03K 7/08
See application file for complete search history.

(56) References Cited

U.S. PATENT DOCUMENTS

| | | | |
|---|---|---|---|
| 7,554,514 B2 | 6/2009 | Nozawa | |
| 2009/0115703 A1 | 5/2009 | Cok | |
| 2010/0060626 A1 | 3/2010 | Wang et al. | |
| 2016/0232848 A1* | 8/2016 | Meng | G09G 3/3258 |
| 2016/0351130 A1 | 12/2016 | Kikuchi et al. | |
| 2018/0102397 A1 | 4/2018 | Nie | |
| 2018/0144676 A1* | 5/2018 | Nadershahi | G09G 3/2055 |

FOREIGN PATENT DOCUMENTS

| | | |
|---|---|---|
| CN | 101162563 | 4/2008 |
| CN | 101707046 | 5/2010 |
| CN | 101884061 A | 11/2010 |
| CN | 107492348 | 12/2017 |

\* cited by examiner

*Primary Examiner* — Vinh T Lam
(74) *Attorney, Agent, or Firm* — WPAT, PC

(57) ABSTRACT

The disclosure provides a light emitting diode including a light emitting diode (LED), a first transistor, a second transistor and capacitor. A cathode terminal of the LED is configured to receive a first power supply voltage. A first port of the capacitor coupled to the gate of the first transistor is configured to store a data signal in a first duration. A first port of the second transistor is configured to receive a second power supply voltage. A gate of the second transistor is configured to receive a PWM signal in a second duration. A second port of the second transistor is coupled to the second port of the first transistor. The second transistor is turned on for a conducting time in the second duration according to the PWM signal, and the first transistor provides, in the conducting time, a drive current to the LED according to the data signal.

8 Claims, 9 Drawing Sheets

PIXEL STRUCTURE

CROSS-REFERENCE TO RELATED APPLICATION

This application claims priority to Taiwan Application Serial Number 107133479, filed on Sep. 21, 2018, which is herein incorporated by reference.

BACKGROUND

Field of Disclosure

The disclosure relates to a pixel structure. More particularly, the disclosure relates to a pixel structure associated with a light-emitting diode.

Description of Related Art

In operating waveform process of the general pixel structure, the higher the resolution of the display panel is, the smaller the length of waveform, which could be adjusted in each interval, will be. Because the adjustable time length becomes small, it is difficult to adjust each pixel light in each time interval.

Further, a current-voltage curve of the LED is usually an exponential curve. That is, the current could become much greater as the voltage is raised to a higher value, such as raised to the value which is higher than some specific value. In addition, it is difficult to adjust the illumination level in each time interval because of the property of the exponential curve.

SUMMARY

The disclosure provides a pixel structure. The pixel structure comprises a light emitting diode, a first transistor, a second transistor, and a capacitor. A cathode terminal of the light emitting diode is configured to receive a first power supply voltage. A first port of the first transistor is coupled to an anode terminal of the light emitting diode. A first port of the capacitor is coupled to a gate of the first transistor, a second port of the capacitor is coupled to the cathode terminal of the light emitting diode, and the capacitor is configured to store a data signal in a first duration. The first port of the second transistor is configured to receive a second power supply voltage, a gate of the second transistor is configured to receive a PWM signal in a second duration, and the second port of the second transistor is coupled to a second port of the first transistor. The second transistor is turned on for a conducting time in the second duration according to the PWM signal, and the first transistor provides, in the conducting time, a drive current to the light emitting diode according to the data signal.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
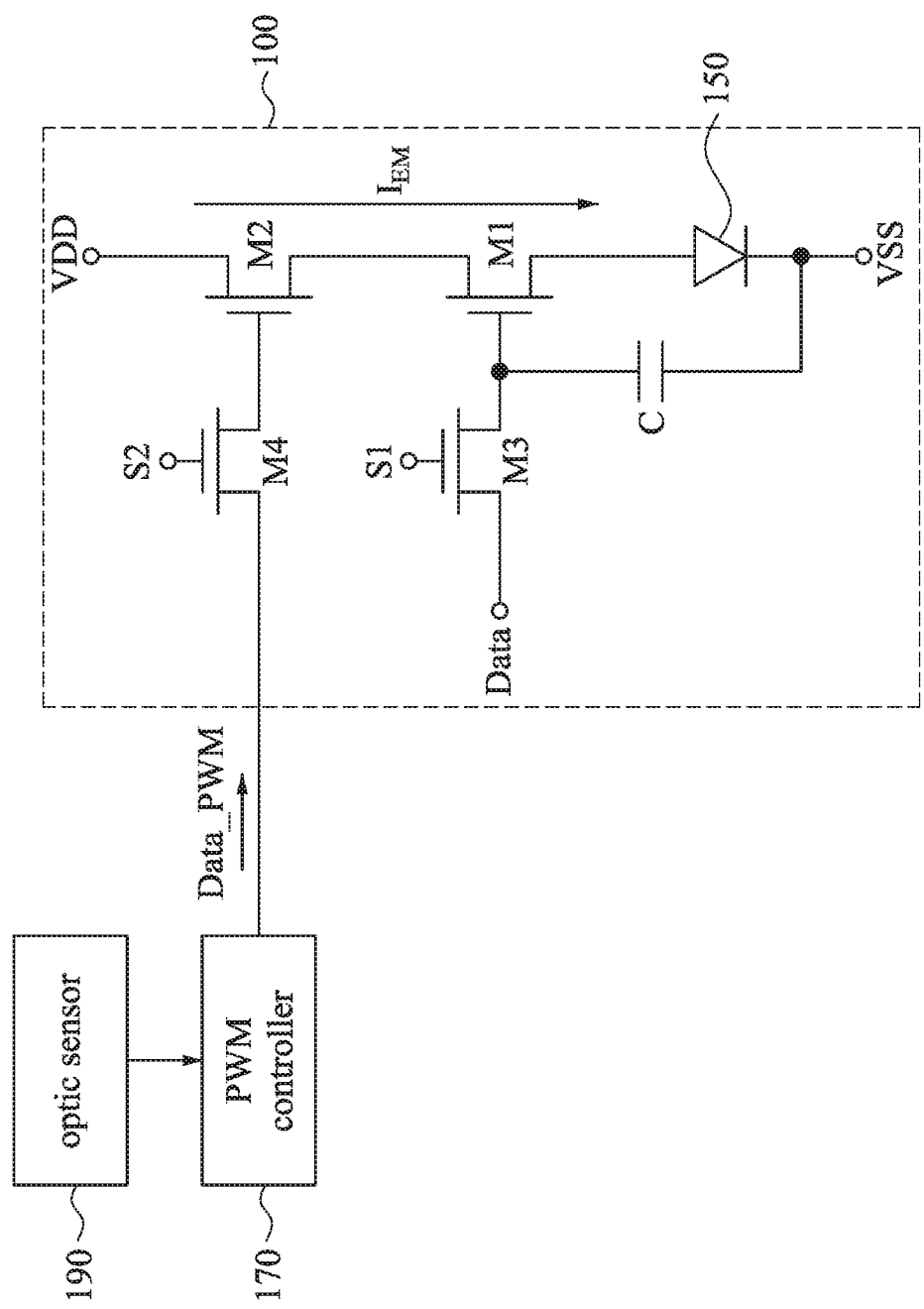
FIG. 1 is a schematic diagram illustrating a pixel structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Please refer to FIG. 1. FIG. 1 is a schematic diagram illustrating a pixel structure 100 according to some embodiments of the present disclosure. As shown in FIG. 1, the pixel structure 100 includes a first transistor M1, a second transistor M2, a third transistor M3, a fourth transistor M4, a capacitor C, and a light emitting diode 150. A cathode terminal of the light emitting diode 150 is configured to receive a first power supply voltage (VSS). The first transistor M1 includes a first port, a gate, and a second port. The first port of the first transistor M1 is coupled to an anode terminal of the light emitting diode 150. The capacitor C includes a first port and a second port. The first port of the capacitor C is coupled to the gate of the first transistor M1, and the second port of the capacitor C is coupled to a cathode terminal of the light emitting diode 150. The capacitor C is configured to store a data signal (Data).

The second transistor M2 includes a first port, a gate, and a second port. The first port of the second transistor M2 is configured to receive a second power supply voltage (VDD). The gate of the second transistor M2 is configured to receive a pulse width modulation signal (Data_PWM) (hereinafter referred to as PWM signal). The second port of the second transistor M2 is coupled to the second port of the first transistor M1.

Figure 2:
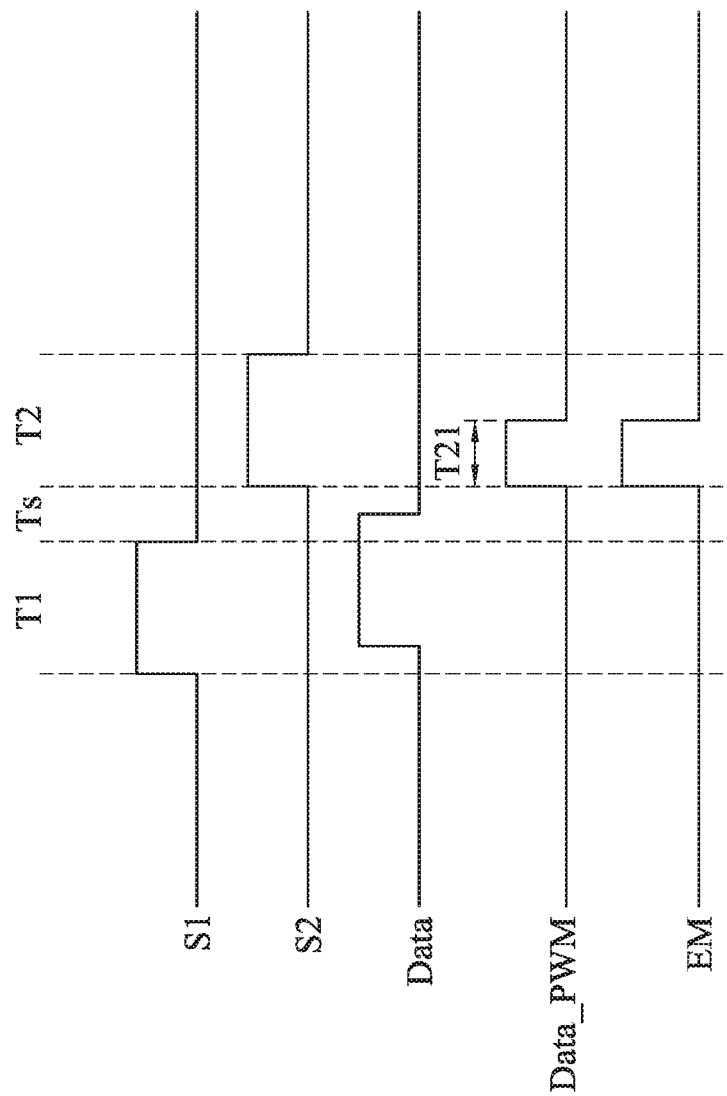
FIG. 2 is a schematic diagram illustrating waveforms of the pixel structure in operative embodiments.

Please refer to FIG. 2. FIG. 2 is a schematic diagram illustrating waveforms of the pixel structure in operative embodiments. As shown in FIG. 1 and FIG. 2, the capacitor C stores the data signal (Data) in a first duration T1, and the second transistor M2 is turned on in a second duration T2 according to the PWM signal (Data_PWM) and maintains the state for a duration of time, that is, a conducting time T21. The second transistor M2 provides the second power supply voltage (VDD) in the conducting time T21. Therefore, the first transistor M1 receives the second power supply voltage (VDD) in the conducting time T21, and provides a drive current to the light emitting diode 150 according to the data signal (Data).

In some embodiment, the gate of the second transistor M2 receives the PWM signal (Data_PWM) in the second duration T2. Accordingly, the second transistor M2 is turned on for the duration of time, that is, the conducting time T21. Meanwhile, the first transistor M1 is turned on according to the voltage stored in the capacitor C, receives the second power supply voltage (VDD) in the conducting time T21, and provides the drive current to the light emitting diode 150 according to the data signal (Data).

In some embodiment, there is a duration Ts between the first duration T1 and the second duration T2, so that the process executed in the first duration T1 in which the data signal (Data) is stored in the capacitor C will not interfere with the process executed in the second duration T2 in which the data signal (Data) stored in the capacitor C is read.

As shown in FIG. 1 and FIG. 2, the third transistor M3 includes a first port, a gate, and a second port. The first port of the third transistor M3 is coupled to the gate of the first transistor M1. The gate of the third transistor M3 is configured to receive a first scanning signal S1, and the second port of the third transistor M3 is configured to receive the data signal (Data). In one embodiment, the second port of the third transistor M3 receives the first data signal (Data) in the first duration T1. The gate of the third transistor M3 is configured to receive the first scanning signal S1 in the first duration T1, such that the third transistor M3 is turned on, and then the first data signal (Data) is written into the capacitor C through the third transistor M3.

As shown in FIG. 1 and FIG. 2, the fourth transistor M4 includes a first port, a gate, and a second port. The first port of the fourth transistor M4 is coupled to the gate of the second transistor M2. The gate of the fourth transistor M4 is configured to receive a second scanning signal S2. The second port of the fourth transistor M4 is configured to receive the PWM signal (Data_PWM). In one embodiment, the second port of the fourth transistor M4 receives the first PWM signal (Data_PWM) in the second duration T2. The gate of the fourth transistor M4 receives the second scanning signal S2 in the second duration T2, so that the fourth transistor M4 is turned on, and then the first PWM signal (Data_PWM) is provided to the gate of the second transistor M2 through the fourth transistor M4.

In one embodiment, the first transistor M1, the second transistor M2, the third transistor M3, and the fourth transistor M4 shown in FIG. 1 can be but not limited to the N-type metal oxide semiconductor field effect transistor (MOSFET).

For more detailed operations of the pixel structure 100 in FIG. 1, please refer to FIG. 1 incorporated with FIG. 2. In the first duration T1, the first scanning signal S1 is at a high level, and the third transistor M3 is turned on according to the first scanning signal S1. In the duration, the second port of the third transistor M3 receives the data signal (Data), and the data signal (Data) is written into and stored in the capacitor C through the third transistor M3. In the second duration T2, the second scanning signal S2 is at the high level, and the fourth transistor M4 is turned on according to the second scanning signal S2. In the duration, the second port of the fourth transistor M4 receives the PWM signal (Data_PWM), and the PWM signal (Data_PWM) is provided to the gate of the second transistor M2 through the fourth transistor M4. The gate of the second transistor M2 is turned on due to the reception of the PWM signal (Data_PWM). The conducting time T21 for the second transistor M2 is associated with the conducting time indicated by the PWM signal (Data_PWM).

On the other hand, in the second duration T2, the second transistor M2 provides the second power supply voltage (VDD) to the first transistor M1, the first transistor M1 is also turned on according to the voltage stored in the capacitor C, and the drive current $I_{EM}$ is output to the light emitting diode 150 in the conducting time T21. The light emitting diode 150 emits light in the second duration T2 according to the drive current $I_{EM}$. As shown in FIG. 1 and FIG. 2, the time of the duration in which the drive current $I_{EM}$ is provided to drive the light emitting diode 150 to emit is the same as the conducting time T21 of the second transistor M2. Accordingly, in the present disclosure, the continuing time that the light emitting diode 150 emits light can be adjusted by changing the PWM signal (Data_PWM) in the second duration T2. Moreover, in the present disclosure, the data signal (Data) can be written into the gate of the first transistor M1 in the first duration T1, so that the light emitting diode 150 emits light in the second duration T2 according to the data signal (Data) written in the first duration T1, and lasts emitting light for the continuing time.

Please refer to FIG. 2 again, a sub-duration Ts is between the first duration T1 and the second duration T2. A high-level signal of the data signal (Data) crosses the first duration T1 and a sub-duration Ts. In the first duration T1, the data signal (Data) is written into the capacitor C. In the sub-duration Ts, the first scanning signal S1 is at a low-level, and the capacitor C stops storing the data signal (Data). The higher resolution the control panel has, the shorter the time slot controlled by each pixel-level of the control panel will be. The design of the disclosure can ensure that there is a buffer time (i.e. the sub-duration Ts) between the second duration T2 and the first duration T1, to avoid the instability at the data-storing stage of the capacitor C.

As shown in FIG. 2, in one embodiment, the continuing time of the high-level of the data signal (Data) is longer than that of the first scanning signal S1. In another embodiment, the continuing time of the pulse width modulation signal (Data_PWM) is less than that of the second scanning signal S2.

As shown in FIG. 1, the PWM controller 170 is coupled with the optic sensor 190. The optic sensor 190 is configured to output an optical-sensed signal. The PWM controller 170 is configured to adjust the PWM signal according to the optical-sensed signal received from the optic sensor 190. Accordingly, the illuminating time of the light emitting diode 150 can be adjusted according to the current ambient light.

In one embodiment, the PWM signal includes a first PWM signal and a second PWM signal. The data signal includes a first data signal and a second data signal. In FIG. 1, the first transistor M1 receives the first data signal in the first duration T1 (as shown in FIG. 2). The second transistor M2 receives the first PWM signal in the second duration T2. Similar to the aforesaid statements, the second transistor M2 turns on according to the first PWM signal, and continues turning on for a first conducting time. The first transistor M1 provides a first drive current to the light emitting diode 150 for the first conducting time according to the first data signal. The light emitting diode 150 illuminates for the first conducting time of the second duration T2 according to the first drive current. In one embodiment, one period (the first period) includes the first duration T1 and the second duration T2, and the first transistor M1 outputs the first drive current in the first period.

In one embodiment, after the first transistor M1 outputs the first drive current, in the third duration T3 (not shown in FIG. 2) which is after the second duration T2, the second data signal is stored in the first port of the capacitor C through the third transistor M3. In the fourth duration (not shown in FIG. 2) which is after the third duration, the second PWM signal is transmitted to the gate of the second transistor M2 through the fourth transistor M4, so that the second transistor M2 continues turning on for the second conducting time. In the fourth duration, the first transistor M1 provides the second drive current to the light emitting diode 150 in the second conducting time according to the second data signal. The light emitting diode 150 illuminates for the second conducting time of the fourth duration according to the second drive current. In one embodiment, another period (the second period) includes the third duration T3 and the fourth duration T4, and the first transistor M1 outputs the second drive current $I_{EM2}$ in the second period.

Similarly, one period includes two durations. In each period, there is a conducting time corresponding to each period for controlling the illuminating time to compensate the light. For example, by increasing the illuminating time slightly, the data voltage used for controlling the light-emitted level can be slightly decreased correspondingly. In the first period and the second period, the first drive current $I_{EM1}$ cooperates in the first conducting time and the second drive current $I_{EM2}$ cooperates in the second conducting time. In response to adjusting a relation of the first conducting time and the second conducting time, the drive current $I_{EM}$ outputted by the first transistor M1 will be close to or the same with linear relations in the condition of adding the same voltage in a long illuminating time.

Figure 3:
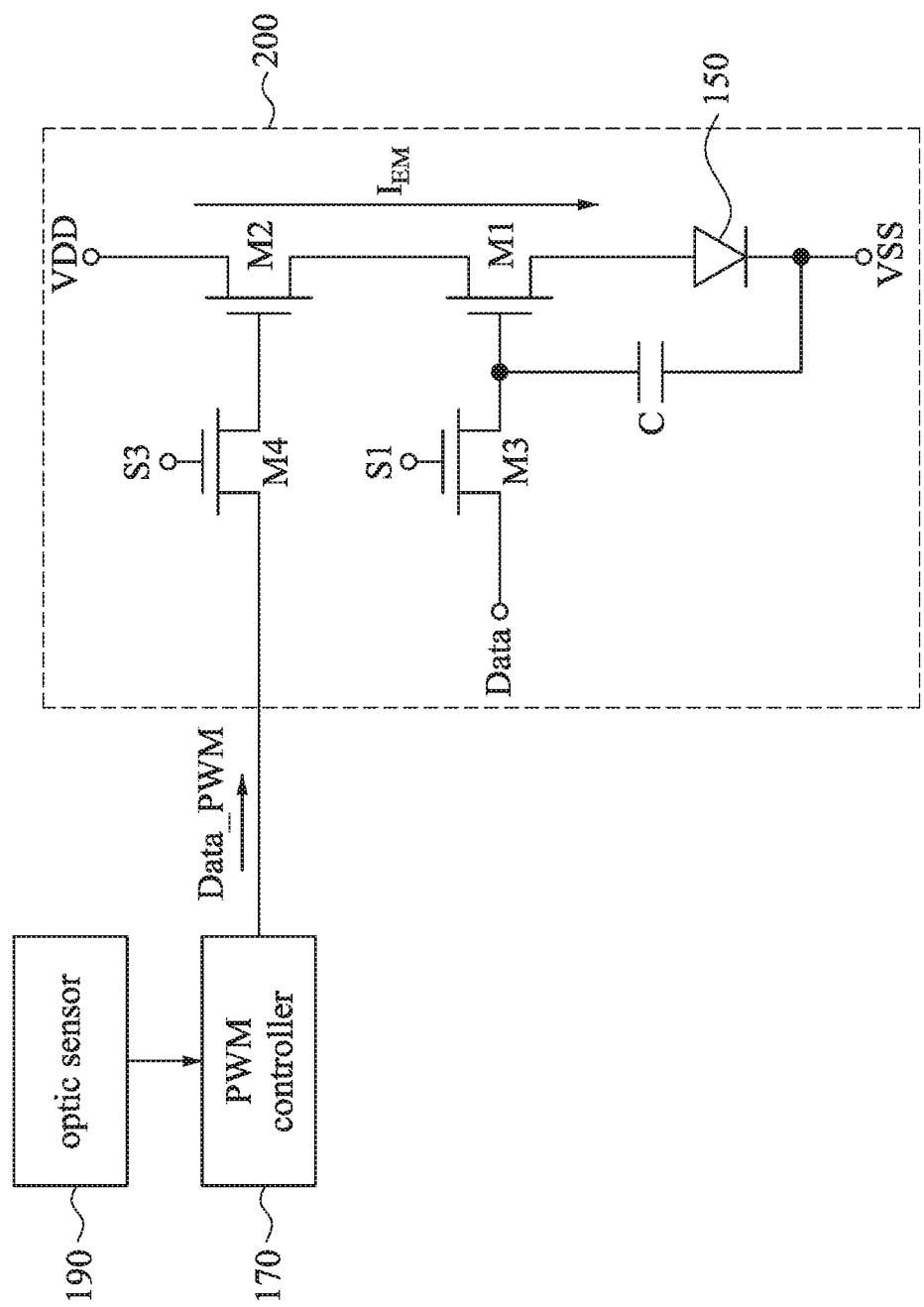
FIG. 3 is a schematic diagram illustrating the pixel structure according to some embodiments of the present disclosure.

Please refer to FIG. 3. FIG. 3 is a schematic diagram illustrating the pixel structure 200 according to some embodiments of the present disclosure. In accordance with FIG. 1, the same elements are illustrated by the same notations and the corresponding illustrations are eliminated hereinto. In the pixel structure 200 of FIG. 3, the gate of the fourth transistor M4 is configured to receive the third scanning signal S3.

Figure 4:
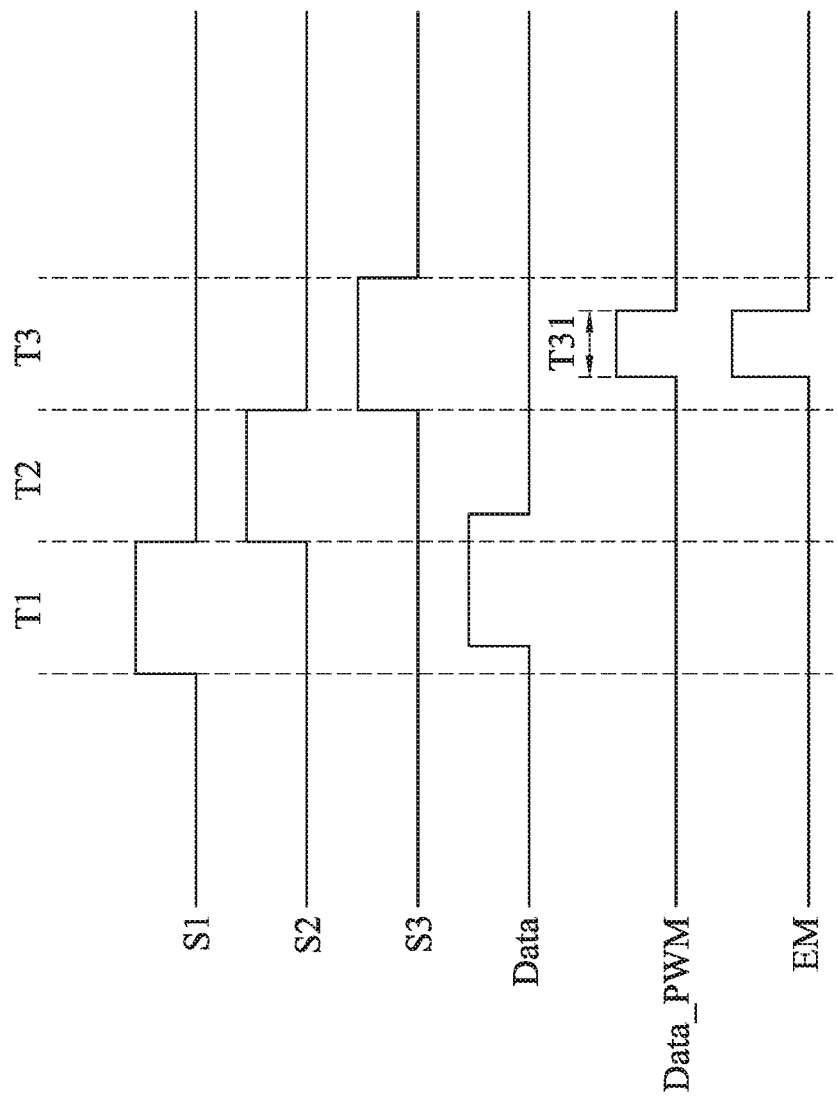
FIG. 4 is a schematic diagram illustrating waveforms of the pixel structure of FIG. 3 according some operative embodiments of the present disclosure.

Please refer to FIG. 4. FIG. 4 is a schematic diagram illustrating waveforms of the pixel structure 200 of FIG. 3 according some operative embodiments of the present disclosure. The following statements are based on FIG. 3 and FIG. 4. In the first duration T1, the first scanning signal S1 is at the high-level, and the third transistor M3 is turned on according to the first scanning signal S1. In the duration, the second port of the third transistor M3 receives the data signal (Data), and the data signal is stored in the capacitor C through the third transistor M3. In the second duration T2 which is after the first duration T1, the high-level of the data signal (Data) crosses the first duration T1 and the second duration T2. In the second duration T2, the first scanning signal S1 is at the low-level, and the capacitor C stops storing the data signal (Data). In the third duration T3, the third scanning signal S3 is at the high-level, and the fourth transistor T4 is turned on according to the third scanning signal S3. In the duration, the second port of the fourth transistor T4 receives the PWM signal (Data_PWM), and the PWM signal (Data_PWM) is provided to the gate of the second transistor M2 through the fourth transistor M4. The gate of the second transistor M2 turns on according to the PWM signal (Data_PWM) received. The conducting time T31 for the second transistor M2 is associated with the conducting time indicated by the PWM signal (Data_PWM).

On the other hand, in the third duration T3, the second transistor M2 provides the second power supply voltage (VDD) to the first transistor M1. The first transistor M1 turns on according to the voltage stored in the capacitor C, and the drive current $I_{EM}$ is provided to the light emitting diode 150 according to the conducting time T31. The light emitting diode 150 emits in the second duration T2 according to the drive current $I_{EM}$. Because the time of the duration in which the drive current $I_{EM}$ is provided to drive the light emitting diode 150 to emit is the same as the conducting time T31 of the second transistor M2, in one embodiment, the PWM signal (Data_PWM) in the third duration T3 can be adjusted, such that the continuing time which the light emitting diode 150 emits light can be adjusted accordingly. Moreover, in one embodiment, the data signal (Data) can be written into the gate of the first transistor M1 in first duration T1 in advance, and then the light emitting diode 150 emits light in the third duration T3 according to the data signal (Data) which is received in the first duration T1, and emits light in the continuing time.

In one embodiment, the first duration T1, the second duration T2 and the third duration T3 have the same duration or time length. The first scanning signal S1, the second scanning signal S2, and the third scanning signal S3 are putted into practice by shift registers, such that the first scanning signal S1, the second scanning signal S2, and the third scanning signal S3 are outputted one-by-one in each of the durations sequentially.

Figure 5:
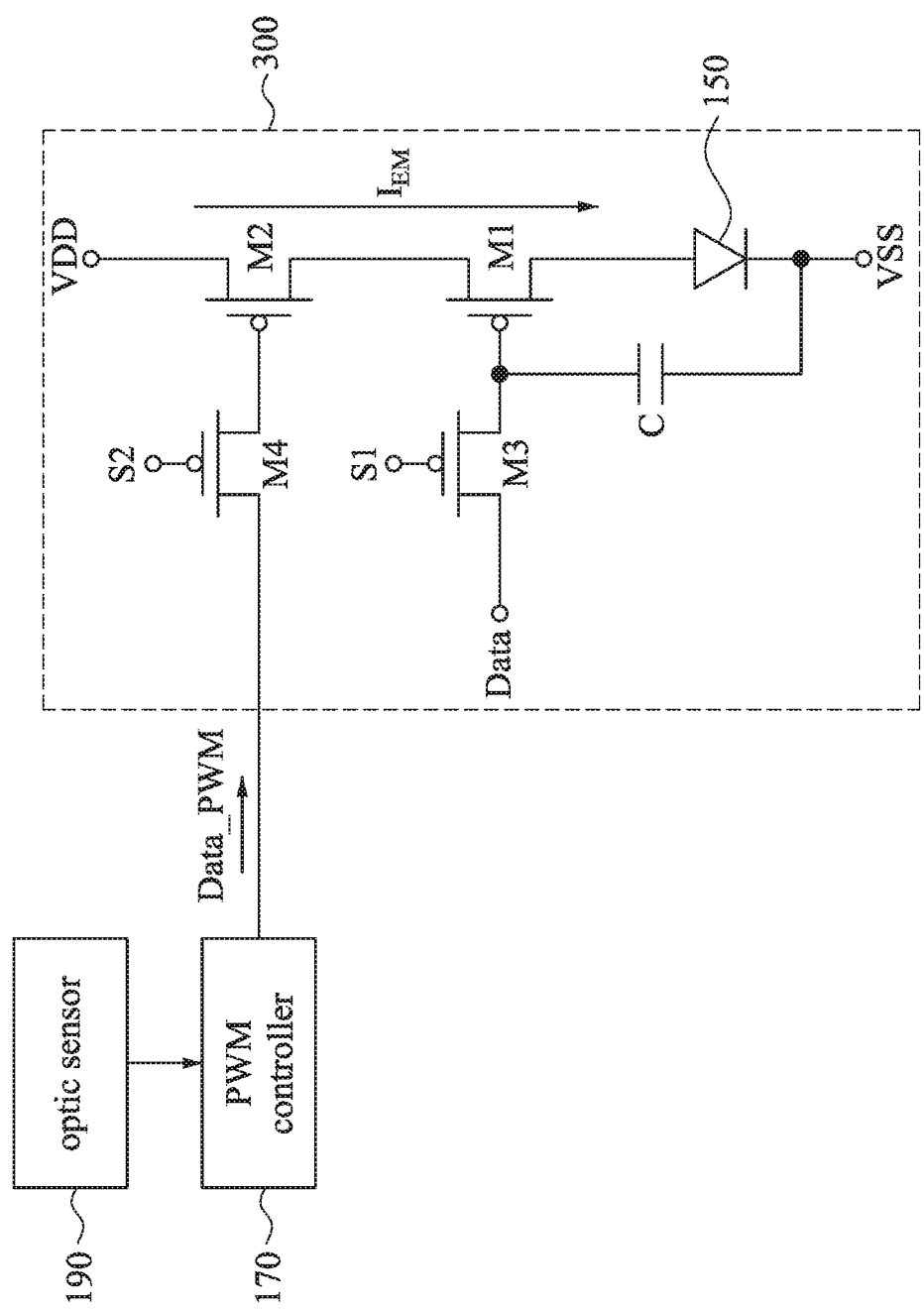
FIG. 5 is a schematic diagram illustrating the pixel structure according to some embodiments of the present disclosure.

Please refer to FIG. 5. FIG. 5 is a schematic diagram illustrating the pixel structure 300 according to some embodiments of the present disclosure. The difference between the pixel structure 300 of FIG. 5 and the pixel structure 100 of FIG. 1 is that the first transistor M1, the second transistor M2, the third transistor M3, and the fourth transistor M4 in FIG. 5 are the P-type metal oxide semiconductor field effect transistor (MOSFET).

Figure 6:
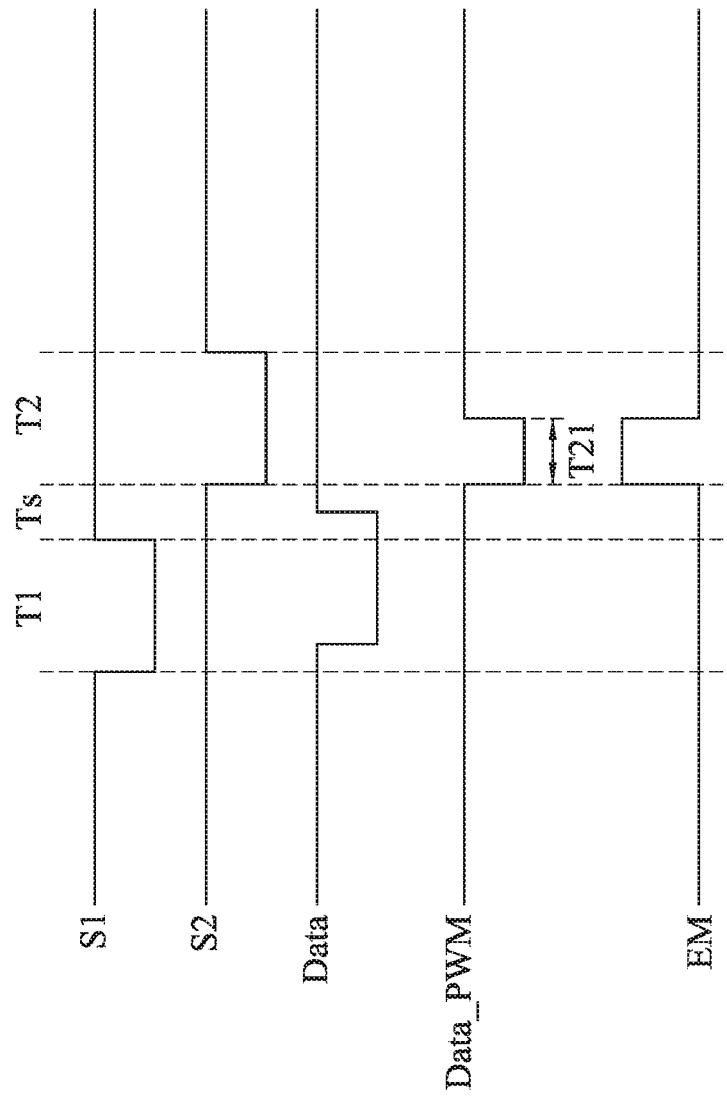
FIG. 6 is a schematic diagram illustrating waveforms of the pixel structure of FIG. 5 according some operative embodiments of the present disclosure.

Please refer to FIG. 6. FIG. 6 is a schematic diagram illustrating waveforms of the pixel structure 300 of FIG. 5 according some operative embodiments of the present disclosure. As shown in FIG. 6, when the first scanning signal S1 and the second scanning signal S2 are at the low-level, the third transistor M3 and the fourth transistor M4 are turned on for the first duration T1 and for the second duration T2 respectively. The level of the operating waveforms in FIG. 6 is the inverse state of the level of the operating waveforms in FIG. 2. For example, the first scanning signal S1 of the first duration T1 in FIG. 6 is the low-level, which the N-type MOSFET is applied in FIG. 1 and is controlled by the operating waveforms in FIG. 2, and the first scanning signal S1 of the first duration T1 in FIG. 2 is the high-level, which the P-type MOSFET is applied in FIG. 5 and is controlled by the operating waveforms in FIG. 6. The operations in FIG. 5 and FIG. 6 are similar to the operations in FIG. 1 and FIG. 2, and the corresponding illustrations are not repeated hereinafter.

Figure 7:
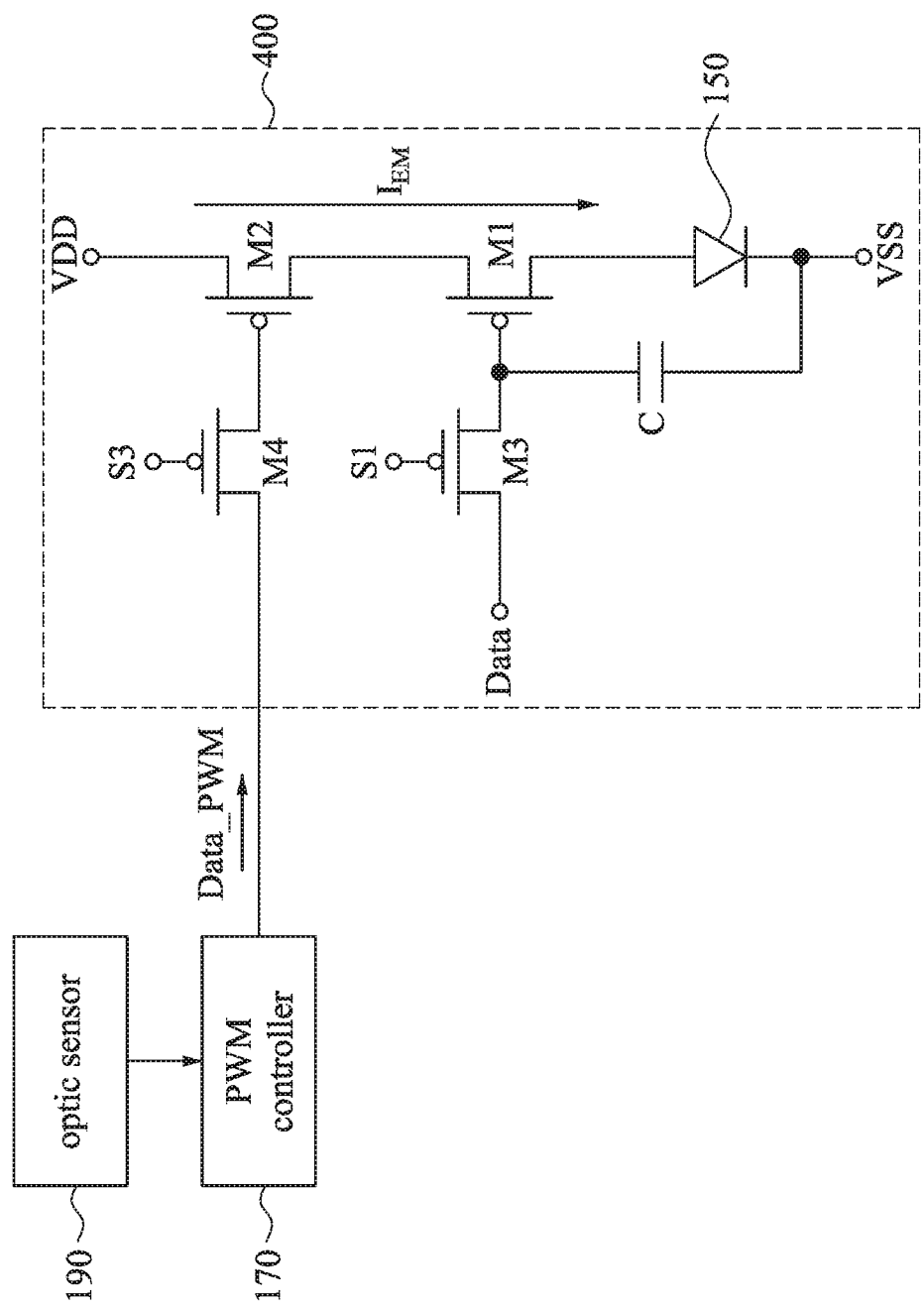
FIG. 7 is a schematic diagram illustrating the pixel structure according to some embodiments of the present disclosure.

Please refer to FIG. 7. FIG. 7 is a schematic diagram illustrating the pixel structure 400 according to some embodiments of the present disclosure. The difference between the pixel structure 400 of FIG. 7 and the pixel structure 200 of FIG. 3 is that the first transistor M1, the second transistor M2, the third transistor M3, and the fourth transistor M4 in FIG. 7 are the P-type MOSFET.

Figure 8:
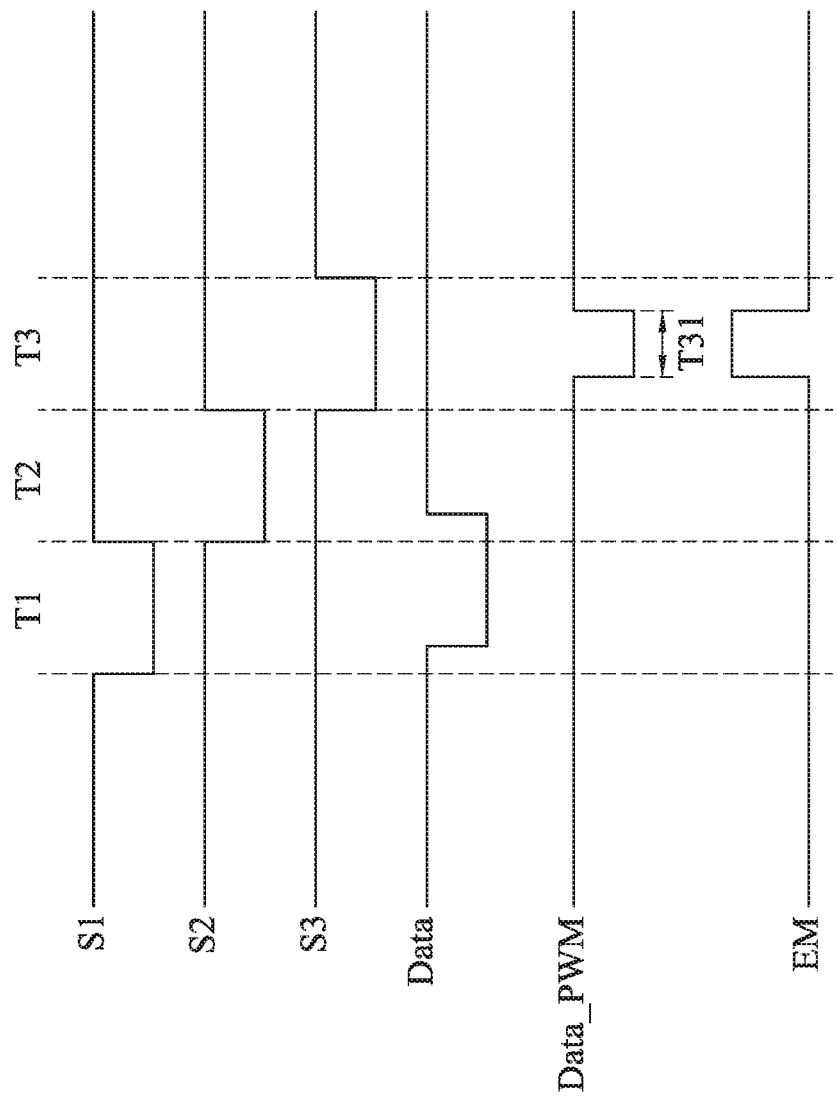
FIG. 8 is a schematic diagram illustrating waveforms of the pixel structure of FIG. 7 according some operative embodiments of the present disclosure.

Please refer to FIG. 8. FIG. 8 is a schematic diagram illustrating waveforms of the pixel structure 400 of FIG. 7 according some operative embodiments of the present disclosure. As shown in FIG. 8, when the first scanning signal S1 and the second scanning signal S2 are at the low-level, the third transistor M3 and the fourth transistor M4 are turned on for the first duration T1 and for the third duration T3 respectively. The level of the operating waveforms in FIG. 8 is the inverse state of the level of the operating waveforms in FIG. 4. For example, the first scanning signal S1 of the first duration T1 in FIG. 8 is the low-level, which the N-type MOSFET is applied in FIG. 3 and is controlled by the operating waveforms in FIG. 4, and the first scanning signal S1 of the first duration T1 in FIG. 4 is the high-level, which the P-type MOSFET is applied in FIG. 7 and is controlled by the operating waveforms in FIG. 8. The operations in FIG. 7 and FIG. 8 are similar to the operations in FIG. 3 and FIG. 4, and the corresponding illustrations are not repeated hereinafter.

Figure 9:
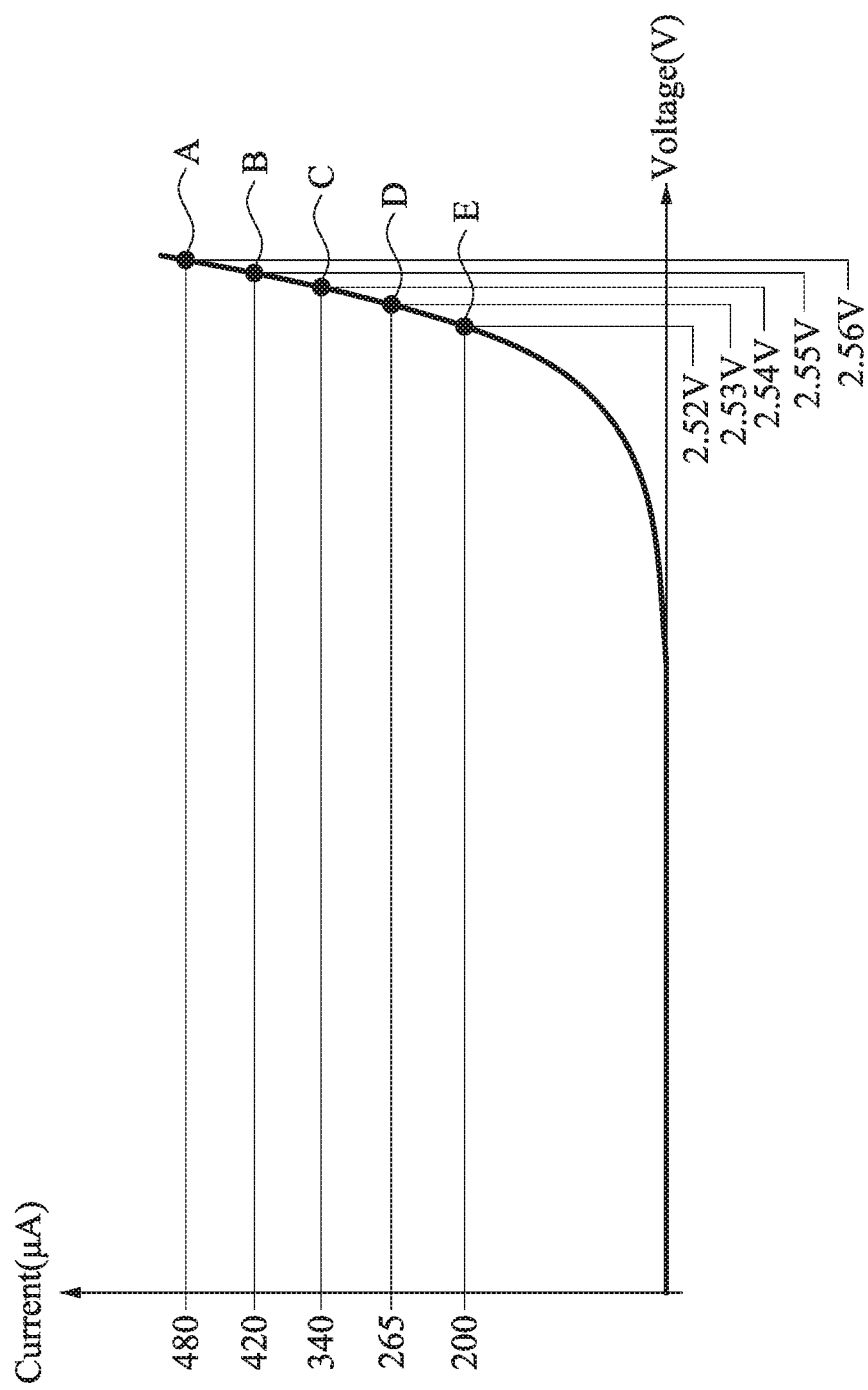
FIG. 9 is a schematic diagram illustrating the drive current and the voltage according to some embodiments of the present disclosure.

Please refer to FIG. 9. FIG. 9 is a schematic diagram illustrating a curve of the drive current values and the voltage values according to some embodiments of the present disclosure. In FIG. 9, the horizontal axis represents the voltage values and the vertical axis represents the drive current values. In one embodiment of the curve graph, the value of the point A is (2.56V, 480 μA), the value of the point B is (2.55V, 420 μA), the value of the point C is (2.54V, 340 μA), the value of the point D is (2.53V, 265 μA), and the value of the point E is (2.52V, 200 μA). In other words, the pixel structures 100~400 work in accordance with the aforesaid operations and the voltage-current curve is the approximately linear curve (shown as the curve of the points A~E).

The following statements illustrate how to achieve the voltage-current curve of FIG. 9, and the relationship between the first drive current $I_{EM}$ and the second drive current outputted by the pixel structure (such as the pixel structures 100, 200, 300, and 400 of FIG. 1, FIG. 3, FIG. 5, and FIG. 7) and the voltage-current curve (such as the voltage-current curve of FIG. 9) is illustrated. It should be noted that the first duration T1 and the second duration T2 of FIG. 2 and FIG. 6 are considered to be one period (in some embodiment, one period also comprises the sub-duration Ts). Similarly, the first duration T1, the second duration T2, and the third duration T3 of FIG. 4 and FIG. 8 are treated as one period. In one embodiment, one "session" comprising two periods can be treated as a base unit for adjusting the entire light illumination. It should be noted that the base unit includes one or more periods and the number of the periods is not limited herein.

In FIG. 1 and FIG. 2, the first duration T1 and the second duration T2 are treated as one period, and two periods are treated as one session. For example, the first duration T1 and the second duration T2 is treated as the first period P1, and the first drive current $I_{EM1}$ is obtained in the first period P1. Similarly, the first duration T1 and the second duration T2 is treated as the second period P2, and the second drive current $I_{EM2}$ is obtained in the second period P2, and so on. Accordingly, the optic sensor 190 or processors (not illustrated) could adjust the voltage-current curve. In one embodiment, the current value of a non-linear curve, such as 480 μA, is divided into four numbers: 480 μA, 360 μA, 240 μA, and 120 μA, and the four numbers are arithmetical series. The current value of the non-linear curve, such as 200 μA, is divided into four numbers: 200 μA, 150 μA, 100 μA, and 50 μA, and the four numbers are arithmetical series. Taking one value from the eight numbers to multiply a ratio, for example, 480 μA*0.5. The result means that the first transistor M1 outputs the first drive current $I_{EM1}$ in the first period. Similarly, taking another one value from the eight values to multiply the ratio, for example, 360 μA*0.5. The result means that the first transistor M1 outputs the second drive current $I_{EM2}$ in the second period. The summation of the two results is calculated by the formula: 480 μA*0.5+ 360 μA*0.5=420 μA. The formula represents the point B of the current-voltage curve. Similarly, the formula: 480 μA*0.5+200 μA*0.5=340 μA, represents the point C of the current-voltage curve. The formula: 480 μA*0.5+50 μA*0.5=265 μA, represents the point D of the current-voltage curve.

Accordingly, the present disclosure provides operations that the pixel structure is controlled to emit in spans of time, and the illumination state of the display panel is controlled by the spans of time. Comparing with the prior art which controls illuminations by the illumination level or by the illumination time, the prevent disclosure avoids the problem that the current increases suddenly when the voltage is increased and is higher than a specific value (such as 2.5V). That is, it is easier to control the illuminations in the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A pixel structure, comprising:
 a light emitting diode, wherein a cathode terminal of the light emitting diode is configured to receive a first power supply voltage;
 a first transistor, wherein a first port of the first transistor is coupled to an anode terminal of the light emitting diode;
 a capacitor, wherein a first port of the capacitor is coupled to a gate of the first transistor, a second port of the capacitor is coupled to the cathode terminal of the light emitting diode, and the capacitor is configured to store a data signal in a first duration;
 a second transistor, wherein a first port of the second transistor is configured to receive a second power supply voltage, a gate of the second transistor is configured to receive a pulse width modulation (PWM) signal in a second duration, and a second port of the second transistor is coupled to a second port of the first transistor;
 a third transistor, wherein a first port of the third transistor is coupled to the gate of the first transistor, a second port of the third transistor is configured to receive the data signal, and a gate of the third transistor is configured to receive, in the first duration, a first scanning signal; and
 a fourth transistor, wherein a first port of the fourth transistor is coupled to the gate of the second transistor, a second port of the fourth transistor is configured to receive the PWM signal, and a gate of the fourth transistor is configured to receive, in the second duration, a second scanning signal,
 wherein the second transistor is turned on for a conducting time in the second duration according to the PWM signal, and the first transistor provides, in the conducting time, a drive current to the light emitting diode according to the data signal.

2. The pixel structure of claim 1, wherein a continuing time of the data signal is longer than a continuing time of the first scanning signal.

3. The pixel structure of claim 2, wherein a continuing time of the PWM signal is less than a continuing time of the second scanning signal.

4. The pixel structure of claim 3, wherein there is a buffer time between a time duration that the third transistor is turned on and the time duration that the fourth transistor is turned on.

5. The pixel structure of claim 4, wherein the gate of the second transistor receives the PWM signal in the second duration so that the first transistor and the second transistor are turned on for the conducting time, wherein the first duration is before the second duration.

6. The pixel structure of claim 5, wherein the PWM signal comprises a first PWM signal and a second PWM signal, and the data signal comprises a first data signal and a second data signal;

wherein the capacitor stores the first data signal in the first duration, and the second transistor receives the first PWM signal in the second duration so that the first transistor provides, in the second duration, a first drive current to the light emitting diode based on a first conducting time of the first PWM signal, wherein the capacitor stores the second data signal in a third duration, and the second transistor receives the second PWM signal in a fourth duration so that the first transistor provides, in the fourth duration, a second drive current to the light emitting diode based on a second conducting time of the second PWM signal.

7. The pixel structure of claim 1, wherein the second port of the capacitor is configured to receive the first power supply voltage.

8. The pixel structure of claim 1, wherein a PWM controller is configured to adjust the PWM signal according to an optical-sensed signal sensed by an optic sensor.

\* \* \* \* \*